United States Patent [19]

Smith et al.

[11] Patent Number: 4,647,852
[45] Date of Patent: Mar. 3, 1987

[54] CONTACT PROBE ASSEMBLY

[75] Inventors: Grant M. Smith, Bryn Athyn; George J. Sprenkle, Phoenixville, both of Pa.

[73] Assignee: Burroughs Corporation, Detroit, Mich.

[21] Appl. No.: 782,949

[22] Filed: Sep. 25, 1985

[51] Int. Cl.$^4$ ............... G01R 31/02; G01R 1/06
[52] U.S. Cl. ................... 324/158 P; 324/72.5
[58] Field of Search ........... 324/158 P, 158 F, 72.5, 324/149, 73 PC; 339/108 TP, 74 R, 75 R, 75 M, 75 MP, 17 C

[56] References Cited

U.S. PATENT DOCUMENTS

| | | | |
|---|---|---|---|
| 2,918,646 | 12/1959 | Davidson | 324/72.5 |
| 2,927,298 | 3/1960 | Griffith | 339/17 C |
| 3,500,288 | 3/1970 | Startin et al. | 339/128 |
| 3,596,228 | 7/1971 | Reed, Jr. et al. | 324/158 F |
| 4,321,533 | 3/1982 | Matrone | 324/158 P |
| 4,361,800 | 11/1982 | Fodali et al. | 324/72.5 |
| 4,420,206 | 12/1983 | Martyniak | 339/75 M |

FOREIGN PATENT DOCUMENTS 2122820  12/1983  United Kingdom ............ 339/74 R

*Primary Examiner*—Ernest F. Karlsen
*Assistant Examiner*—William J. Burns
*Attorney, Agent, or Firm*—Francis A. Varallo; Mervyn L. Young; Kevin R. Peterson

[57] ABSTRACT

The present disclosure describes an assembly which has particular application in the testing of printed circuit boards. More specifically, the assembly is comprised of an apertured holding plate which is registered with the board under test, and a probe subassembly. The latter includes a body member having a spring-actuated plunger type probe and a hook-like member. In operation, the body member is advanced toward the plate and the probe and hook-like member enter respective plate apertures. As electrical contact is made by the probe with a desired test location on the board, the hook-like member locks the body onto the plate. The body member is so formed that subsequent pressure applied thereto will release it from its locked condition.

9 Claims, 2 Drawing Figures

CONTACT PROBE ASSEMBLY

BACKGROUND OF THE INVENTION

The high packaging densities of present day printed circuit boards, such as those used in electronic data processors, has resulted in difficulties in testing board assemblies. One method of testing involves the soldering of the ends of individual leads to the respective locations to be examined. That is, one end of the test lead may be connected to a circuit board pad—the other end to the test/diagnostic equipment. Such an operation requires the services of a highly skilled technician who must not only make the electrical connections, but must be readily available during testing. Moreover, since the test lead is often of considerable length, the danger exists that it may be accidentally pulled, thereby damaging the circuit board pad. Since such boards are very expensive to fabricate, such a possibility must be eliminated.

Another commonly used method of testing is to employ a typical hand-held probe of the type furnished with oscilloscopes. In this case, the test technician must use extreme care to avoid short circuiting the adjacent, closely-spaced test locations. Also, if a large number of locations must be probed, the task becomes arduous because the technician must physically retain the probe at each location for a period of time. If the probe is of the clip type and the location may be accessed by clipping the probe thereto, the same difficulty as noted hereinbefore with respect to board damage may be encountered.

What is required is an easy to use, accurate probe which may be locked in position after deployment and which eliminates the possibility of damage to the printed circuit board. The present invention fills such a need.

SUMMARY OF THE INVENTION

The contact probe assembly of the present invention includes an apertured holding plate and a probe subassembly.

The apertured holding plate includes a plurality of integral pins and spacers adapted respectively to engage registration holes formed in the printed circuit board and to orient the board and plate in parallel, spaced-apart relation. The printed circuit board surface containing the test locations is positioned adjacent a surface of the plate. Such test locations may be randomly distributed over the board surface, but conform to a predetermined grid orientation. The holding plate, on the other hand, is formed of a transparent material and has an overall complement of apertures spaced-apart in accordance with the last mentioned grid.

The probe subassembly is comprised of a generally planar body of resilient material, but having a unitary cylindrical projection emanating from a side wall thereof. A bore is formed in the last mentioned projection which extends longitudinally within the body and exits the opposite side wall thereof. A probe contact of the spring-actuated plunger type (such as that manufactured by Everett/Charles Contact Products, Inc.) is installed within the bore such that its moveable extremity protrudes from the body projection. A rod having a hook-like extremity is mounted longitudinally within the body and protrudes from the same side wall as the body cylindrical projection. The distance between the projection and the hook-like extremity is a function of the grid orientation mentioned hereinbefore.

Assuming that the printed circuit board and the holding plate have been registered with each other, the probe body is advanced toward the outer surface of the plate. The cylindrical body projection enters an aperture homologous to the board test location and the hook-like extremity snaps into another plate aperture. The latter action locks the body onto the plate. The probe extremity contacts the desired board pad and a test lead may access the probe via a slot formed in the body.

A substantially triangular cut-out having its base on the body side wall opposite to that in contact with the plate is provided. In order to remove the body from the plate, for example, to access another test location, the body is squeezed in a direction which tends to close the cut-out. This causes the hook-like extremity to pivot away from the spring probe until it clears the edge of the plate aperture, at which time the probe can be withdrawn.

Other features and advantages of the present invention will become apparent in the detailed description of the invention which follows.

DESCRIPTION OF THE PREFERRED EMBODIMENT

Figure 1:
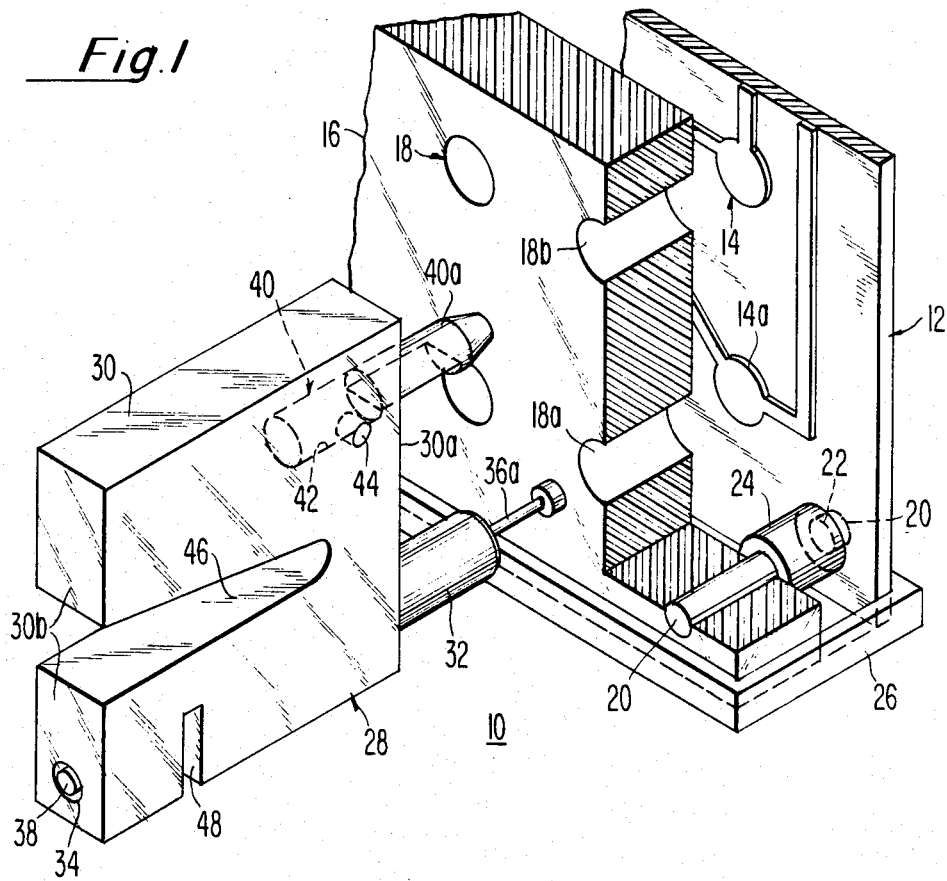
FIG. 1 is an exploded pictorial view of the contact probe assembly of the present invention.

With reference to the exploded pictorial view of FIG. 1, there is depicted the probe assembly 10 of the present invention relative to a printed circuit board 12 under test. The board includes a plurality of circuit pads 14 utilized as test locations and positioned in accordance with a predetermined grid orientation.

A holding plate 16, preferably formed of transparent material, is formed with an overall pattern of apertures 18 having the same grid orientation as that of the board. The plate 16 is registered with board 12 by virtue of pins 20 which are affixed to plate 16 and enter registeration holes 22 in board 12. Spacers 24 orient the board 12 and plate 16 in a predetermined parallel, spaced-apart relation. A frame 26 retains the board and plate in such relation during the test procedure.

The probe subassembly 28 includes a substantially planar body 30 formed of resilient material, such as nylon, and having an integral generally cylindrical projection 32 in a side wall 30a thereof. A bore 34 formed within projection 32 extends completely across the body to the opposite side wall 30b. As better seen in FIG. 2, the probe contact subassembly 28 comprised of a spring probe 36 mounted in a mating receptacle 38 is affixed within bore 34, such as by the use of a suitable adhesive. The plunger-like extremity 36a of the probe protrudes from the body projection 32.

A metallic rod 40 having a hook-like extremity 40a is secured within bore 42 of body 28 by a pin 44 which is pressed through a hole in both the body 28 and the rod 40.

The respective probe and hook-like extremities 36a and 40a are coplanar and spaced a distance apart as a function of the aforementioned grid orientation. Body 28 also includes a generally triangular cut-out 46 having its base disposed along body side wall 30b. The purpose of cut-out 46 will become apparent in the description which follows.

Figure 2:
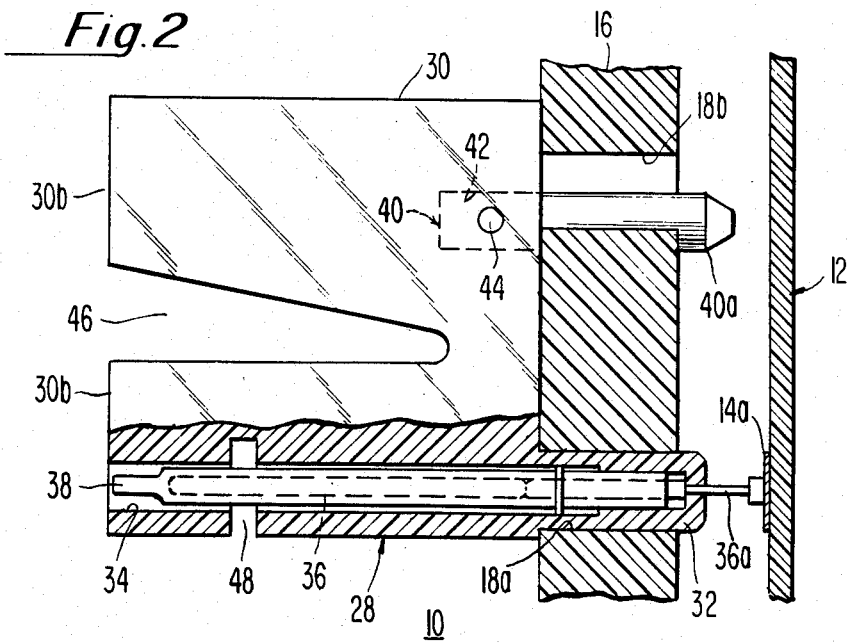
FIG. 2 is a front view of the probe assembly depicted in operative relation to a printed circuit board.

With continued general reference to FIG. 1 and more specific reference to FIG. 2, the operation of the probe assembly 10 will be considered. The body 28 is advanced toward the surface of plate 16. Since plate 16 is transparent, the test location on the board 12 to be probed is readily apparent. The cylindrical body projection 32 enters an aperture 18a in plate 16 homologous to the pad 14a at the last mentioned location on the board 12 and the spring-actuated probe extremity 36a contacts the pad 14a. Simultaneously, the hook-like extremity 40a of rod 40 enters another aperture 18b in plate 16. The triangular cut-out 46 permits the respective probe and hook-like extremities 36a and 40a to pivot away from each other until the latter extremity snaps onto the plate 16. A test slot 48 formed in body 28 provides access to the probe receptacle 38 for establishing electrical contact between the probe extremity 36a in contact with the test pad 14a on the board 12 and a test lead (not shown). The slot 48 permits the test lead to be clipped onto the probe receptable 38 for extended periods without danger of damage to the probe assembly 10 or the printed circuit board 12.

The operation of the hook-like extremity 40a causes the probe subassembly 28 to be locked onto plate 16. In order to remove the probe body 28, it is squeezed in a direction which tends to close the cut-out 46. The resiliency of the body material permits the hook-like extremity 40a to pivot away from the probe extremity 36a. This allows the former extremity to clear the edge of the hole 18b in which it is inserted, at which time the probe can be withdrawn.

In conclusion, there has been disclosed a probe assembly which has proved to be highly satisfactory in the testing of printed circuit boards. Certain details of the assembly, for example, the materials used in its construction, are those which appear in actual operative embodiments of the invention. However, these details have been included solely for purposes of example and are not to be construed as limitative of the invention.

It should be apparent that, depending upon the particular application, changes and modifications of the assembly may be required. Such changes and modifications insofar as they are not departures from the true scope of the invention are intended to be covered by the following claims.

What is claimed is:

1. A contact probe assembly for electrically accessing test locations having a predetermined grid orientation on the surface of a printed circuit board comprising:
   a holding plate having a plurality of apertures formed therein, said apertures being uniformly distributed over substantially the entire surface of said plate, the location of said apertures conforming to said orientation, means for registering said plate with said printed circuit board whereby at least a like number of said apertures are homologously disposed with respect to said test locations, means for orienting said plate and said board in parallel, spaced-apart relation,
   a probe subassembly, said probe subassembly including a body member formed of resilient material, said body member having a projection on a first side thereof, a spring probe having a plunger-like extremity, means for mounting said spring probe within said body member such that said plunger-like extremity extends outward from said projection,
   a rod having a hook-like extremity, means for mounting said rod within said body member such that said hook-like extremity projects from said first side of said body member, said plunger-like extremity and said hook-like extremity being coplanar and being spaced-apart as a function of said grid orientation,
   said body member having a cut-out formed therein, said cut-out being disposed on a second side of said body member opposite to said first side, whereby said hook-like extremity may pivot relative to said plunger-like extremity as the former extremity and said projection simultaneously enter respective apertures in said plate, said hook-like extremity locking said body member onto said plate as said plunger-like extremity contacts a desired test location on said board.

2. A contact probe assembly as defined in claim 1 wherein said means for mounting said spring probe includes a probe receptacle for retaining said spring probe, said body member and said projection having a first bore formed therein for accommodating said probe receptacle.

3. A contact probe assembly as defined in claim 2 wherein said means for mounting said rod includes a second bore formed in said body member and a retaining pin, said body member and said rod having respective corresponding holes formed therein for receiving said retaining pin.

4. A contact probe assembly as defined in claim 3 characterized in that said cut-out formed in said body member has a generally triangular configuration, the base of said cut-out being coincident with said second side of said body member and the vertex of said cut-out being in proximity to, but spaced-apart from, said first side of said body member, and lying substantially midway between said first and second bores, whereby the application of pressure to said body member in a direction which tends to close said cut-out causes said hook-like extremity to pivot away from said plunger-like extremity, thereby releasing said body member from a locked condition.

5. A contact probe assembly as defined in claim 4 further including a test lead slot formed in said body member, said slot intersecting said first bore and being oriented transverse thereto, whereby said probe receptacle is accessible for test purposes.

6. A contact probe assembly as defined in claim 5 wherein said plate is formed of transparent material whereby said test locations on said printed circuit board are readily visible therethrough.

7. A contact probe assembly as defined in claim 6 characterized in that said body member has a generally rectangular configuration but includes said projection as a unitary structure having a cylindrical form.

8. A contact probe assembly as defined in claim 7 further characterized in that said projection has a chamfered end to facilitate its entrance into a preselected aperture of said plate.

9. A contact probe assembly as defined in claim 8 wherein said body member is nylon and said rod is metal.

* * * * *